(12) United States Patent
Endo et al.

(10) Patent No.: US 7,727,707 B2
(45) Date of Patent: *Jun. 1, 2010

(54) BARRIER FILM MATERIAL AND PATTERN FORMATION METHOD USING THE SAME

(75) Inventors: Masayuki Endo, Osaka (JP); Masaru Sasago, Osaka (JP)

(73) Assignee: Panasonic Corporation, Osaka (JP)

( * ) Notice: Subject to any disclaimer, the term of this patent is extended or adjusted under 35 U.S.C. 154(b) by 1259 days.

This patent is subject to a terminal disclaimer.

(21) Appl. No.: 11/224,980

(22) Filed: Sep. 14, 2005

(65) Prior Publication Data

US 2006/0127812 A1 Jun. 15, 2006

(30) Foreign Application Priority Data

Dec. 10, 2004 (JP) ............................. 2004-358129

(51) Int. Cl.
G03F 7/26 (2006.01)
(52) U.S. Cl. ...................................... 430/311; 430/961
(58) Field of Classification Search ................. 430/311, 430/961
See application file for complete search history.

(56) References Cited

U.S. PATENT DOCUMENTS

| 6,180,320 | B1 | 1/2001 | Saito et al. | |
|---|---|---|---|---|
| 7,556,914 | B2 * | 7/2009 | Endo et al. | 430/311 |
| 2006/0105272 | A1 * | 5/2006 | Gallagher et al. | 430/311 |
| 2006/0154170 | A1 * | 7/2006 | Endo et al. | 430/270.1 |
| 2006/0154188 | A1 * | 7/2006 | Hirayama et al. | 430/338 |
| 2007/0166639 | A1 * | 7/2007 | Araki et al. | 430/270.1 |

FOREIGN PATENT DOCUMENTS

| EP | 1 632 811 A | 3/2006 |
|---|---|---|
| JP | 2000-035672 | 2/2000 |
| JP | 2004-054209 | 2/2004 |
| JP | 2005-275365 | 10/2005 |
| WO | WO 2004/074937 | 9/2004 |
| WO | WO 2004/076535 A1 | 9/2004 |
| WO | WO 2004/079800 A1 | 9/2004 |
| WO | WO 2004/088429 A1 | 10/2004 |
| WO | WO 2005/019937 A1 | 3/2005 |

OTHER PUBLICATIONS

Japanese Office Action, with English Translation, issued in corresponding Japanese Patent Application No. 2004-358129, dated on Oct. 30, 2007.
Switkes, M. et al. "Resolution Enhancement of 157 nm Lithography By Liquid Immersion, Proceeding of SPIE." Massachusetts Institute of Technology, 2002.
Switkes, M., et al. "Immersion lithography at 157 nm", J. Vac. Sci. Technol., vol. B19, p. 2353 (2001).
Smith, Bruce, W., et al., "Approaching the numerical aperture of water—Immersion Lithography at 193 nm", Proc. SPIE, vol. 5377, p. 273 (2004).
European Search Report issued in Patent Application No. 05019932.2-2222 dated on Nov. 24, 2008.

* cited by examiner

*Primary Examiner*—Kathleen Duda
(74) *Attorney, Agent, or Firm*—McDermott Will & Emery LLP (57) ABSTRACT

A resist film is first formed on a substrate. Subsequently, a barrier film including a basic compound of, for example, dicyclohexylamine is formed on the resist film. Thereafter, with an immersion liquid including cesium sulfate provided on the barrier film, pattern exposure is carried out by selectively irradiating the resist film with exposing light through the barrier film. Then, after removing the barrier film, the resist film having been subjected to the pattern exposure is developed, so as to form a resist pattern in a good shape.

16 Claims, 10 Drawing Sheets

BARRIER FILM MATERIAL AND PATTERN FORMATION METHOD USING THE SAME

CROSS-REFERENCE TO RELATED APPLICATIONS

This application claims priority under 35 U.S.C. §119 on Patent Application No. 2004-358129 filed in Japan on Dec. 10, 2004, the entire contents of which are hereby incorporated by reference.

BACKGROUND OF THE INVENTION

The present invention relates to a material for a barrier film formed on a resist film for use in immersion lithography in fabrication process or the like for semiconductor devices and a pattern formation method using the same.

In accordance with the increased degree of integration of semiconductor integrated circuits and downsizing of semiconductor devices, there are increasing demands for further rapid development of lithography technique. Currently, pattern formation is carried out through photolithography using exposing light of a mercury lamp, KrF excimer laser, ArF excimer laser or the like, and use of $F_2$ laser lasing at a shorter wavelength is being examined. However, since there remain a large number of problems in exposure systems and resist materials, photolithography using exposing light of a shorter wavelength has not been put to practical use.

In these circumstances, immersion lithography has been recently proposed for realizing further refinement of patterns by using conventional exposing light (for example, see M. Switkes and M. Rothschild, "Immersion lithography at 157 nm", J. Vac. Sci. Technol., Vol. B19, p. 2353 (2001)).

In the immersion lithography, a region in an exposure system sandwiched between a projection lens and a resist film formed on a wafer is filled with a liquid having a refractive index n (whereas n>1) and therefore, the NA (numerical aperture) of the exposure system has a value n·NA. As a result, the resolution of the resist film can be improved.

Also, in the immersion lithography, use of an acidic solution as an immersion liquid has been recently proposed for further improving the refractive index (see, for example, B. W. Smith, A. Bourov, Y. Fan, L. Zavyalova, N. Lafferty, F. Cropanese, "Approaching the numerical aperture of water—Immersion Lithography at 193 nm", Proc. SPIE, Vol. 5377, p. 273 (2004)).

Now, a conventional pattern formation method employing the immersion lithography will be described with reference to FIGS. 10A through 10D.

First, a positive chemically amplified resist material having the following composition is prepared:

| | |
|---|---|
| Base polymer: poly((norbornene-5-methylene-t-butylcarboxylate) (50 mol %) - (maleic anhydride) (50 mol %)) | 2 g |
| Acid generator: triphenylsulfonium triflate | 0.04 g |
| Quencher: triethanolamine | 0.002 g |
| Solvent: propylene glycol monomethyl ether acetate | 20 g |

Figure 10A:
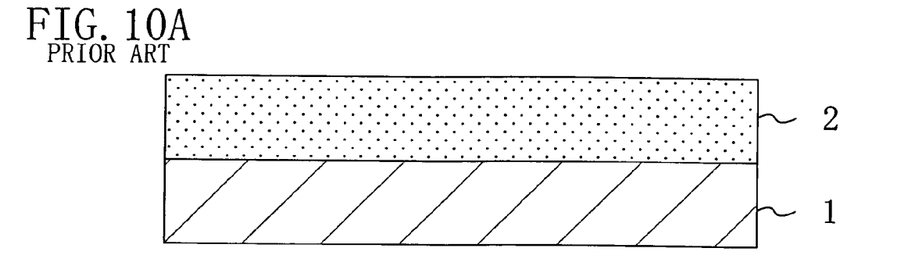
FIGS. 10A, 10B, 10C and 10D are cross-sectional views for showing procedures in a conventional pattern formation method employing immersion lithography.

Next, as shown in FIG. 10A, the aforementioned chemically amplified resist material is applied on a substrate 1 so as to form a resist film 2 with a thickness of 0.35 μm.

Figure 10B:
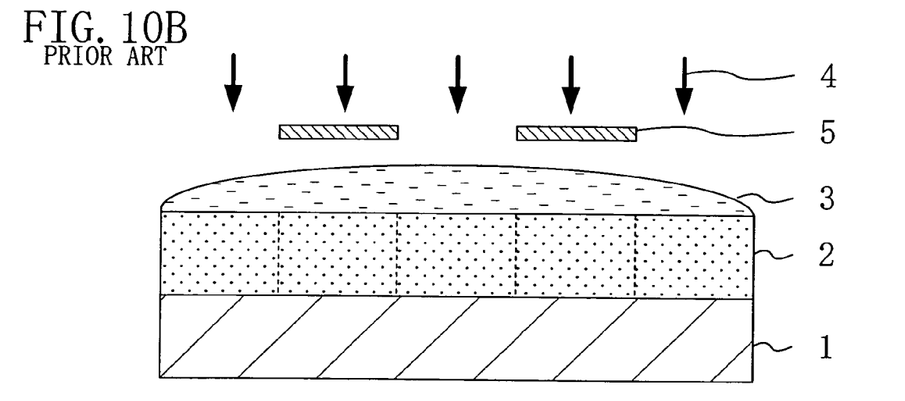

Then, as shown in FIG. 10B, with an immersion liquid 3 including 5 wt % of cesium sulfate provided on the resist film 2, pattern exposure is carried out by irradiating the resist film 2 with exposing light 4 of ArF excimer laser with NA of 0.68 through a mask 5.

Figure 10C:
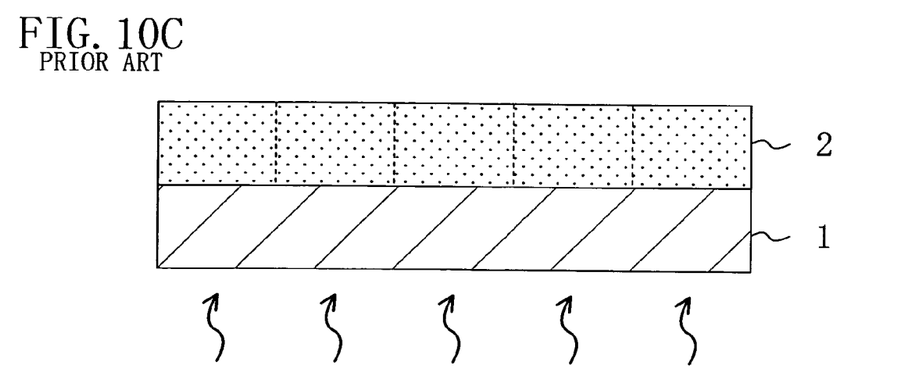

After the pattern exposure, as shown in FIG. 10C, the resist film 2 is baked with a hot plate at a temperature of 105° C. for 60 seconds, and the resultant resist film is developed with a 2.38 wt % tetramethylammonium hydroxide developer. In this manner, a resist pattern 2a made of an unexposed portion of the resist film 2 is formed as shown in FIG. 10D.

Figure 10D:
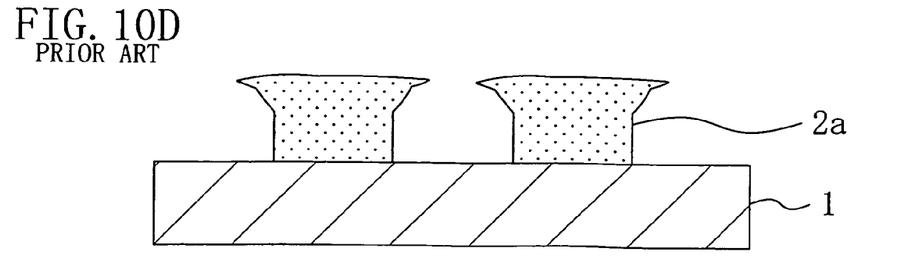

However, as shown in FIG. 10D, the resist pattern 2a obtained by the conventional pattern formation method is in a defective shape.

SUMMARY OF THE INVENTION

The present inventors have variously examined the reason why the resist pattern formed by the conventional immersion lithography is in a defective shape, resulting in finding the following: The resist film cannot exhibit its expected performance because a low-molecular-weight compound such as the acid generator or the quencher is eluted from the resist film 2 into the liquid 3 provided on the resist film 2 or because the liquid 3 permeates into the resist film 2. For example, in the case shown in FIG. 10D, the resist pattern 2a is in a defective shape with a T-top shaped portion probably because the concentration of an acid generated from the acid generator is lowered on the interface between an exposed portion and the unexposed portion of the resist film 2. On the contrary, when the concentration of the quencher used for deactivating the acid is lowered, the resultant resist pattern 2a is in a defective shape with round shoulders.

In either case, when the resist pattern 2a in such a defective shape is used for etching a target film, the resultant pattern of the target film is also in a defective shape, which disadvantageously lowers the productivity and the yield in the fabrication process for semiconductor devices.

In consideration of the aforementioned conventional problem, an object of the invention is forming a fine resist pattern in a good shape by preventing the influence of an immersion liquid used in the immersion lithography on a resist film.

The present inventors have found, on the basis of the aforementioned result of the examination, that a component of a resist film can be prevented from eluting into a liquid or a liquid can be prevented from permeating into a resist film by forming a barrier film including a basic compound on the resist film so as not to allow the resist film to be in direct contact with the liquid provided thereon.

Specifically, when a barrier film including a basic compound is formed on a resist film before exposure, the influence of an immersion liquid on the resist film can be prevented. The barrier film including a basic compound inhibits permeation of the liquid into the barrier film particularly when the liquid is acidic, and therefore, the film quality of the barrier film is stabilized. As the acidic liquid, a cesium sulfate ($Cs_2SO_4$) aqueous solution, a phosphoric acid ($H_3PO_4$) aqueous solution or the like can be used. It is noted that the acidic liquid is sometimes used for increasing the refractive index of the immersion liquid. However, the immersion liquid is not always acidic but can be general water, and the barrier film according to the invention can prevent the permeation of the liquid into a resist film or the elution of a resist component from the resist film by preventing the resist film from coming in contact with the liquid.

The present invention was devised on the basis of the aforementioned findings, and a barrier film for preventing an immersion liquid from permeating into a resist film or for preventing a component of a resist film from eluting into an immersion liquid is formed on the resist film, so that the resist film can keep its expected performance. Specifically, the present invention is practiced as follows:

The barrier film material of this invention is a barrier film material for use in forming a barrier film between a resist film and an immersion liquid when exposure of the resist film is performed with the immersion liquid provided above the resist film, and includes a polymer and a basic compound.

According to the barrier film material of this invention, since a barrier film formed between a resist film and a liquid includes a basic compound, elution of a component of the resist film such as an acid generator or a quencher and permeation of the liquid into the resist film is prevented. Therefore, the resist film keeps the expected performance of a chemically amplified resist during the exposure, and hence, a resist pattern can be formed in a good shape.

The content of the basic compound is preferably approximately 0.01 wt % through 50 wt % and more preferably approximately 0.1 wt % through 10 wt % based on the polymer included in the barrier film material, which does not limit the invention.

In the barrier film material of this invention, the basic compound is preferably a cycloaliphatic amine among aliphatic amines. The cycloaliphatic amine can be cyclopentylamine, dicyclopentylamine, tricyclopentylamine, cyclohexylamine, dicyclohexylamine or tricyclohexylamine, all of which are good at a barrier property. This is probably because a cycloaliphatic group is hydrophobic and hence the effect to prevent the permeation of the immersion liquid can be further improved when it is included in the barrier film. Also, a cycloaliphatic group includes neither a double bond nor a triple bond of carbons but includes merely a C—C bond in its cyclic structure. In other words, it includes neither a double bond nor a triple bond of carbons that has high light absorption, and therefore, high transparency against light can be kept.

Since the exposure is performed with the barrier film formed on the resist film in this invention, if the transparency of the barrier film is low, exposing light does not sufficiently reach the resist film and hence a pattern cannot be formed with high accuracy. Accordingly, it is significant to use a barrier film that keeps high transparency against the exposing light and has a property to prevent the permeation of the immersion liquid. Therefore, according to the invention, a cycloaliphatic amine is included in the barrier film including, for example, an alcohol-soluble polymer as a base polymer. Thus, while keeping high transparency against the exposing light, the barrier film attains high resistance particularly against change of a hydrogen ion concentration exponent (pH) of the immersion liquid.

The basic compound can be a primary aliphatic amine, a secondary aliphatic amine, a tertiary aliphatic amine, an aromatic amine, an amide derivative, an imide derivative or a nitrogen-containing compound having a hydroxy group.

The primary aliphatic amine can be ammonia, methylamine, ethylamine, n-propylamine, isopropylamine, n-butylamine or isobutylamine.

The secondary aliphatic amine can be dimethylamine, diethylamine, di-n-propylamine, diisopropylamine, di-n-butylamine, diisobutylamine, di-sec-butylamine, dipentylamine, dicyclopentylamine, dihexylamine or dicyclohexylamine.

The tertiary aliphatic amine can be trimethylamine, triethylamine, tri-n-propyl amine, triisopropylamine, tri-n-butyl amine, triisobutylamine, tri-sec-butylamine, tripentylamine, tricyclopentylamine, trihexylamine, tricyclohexylamine, dimethylethylamine, methylethylpropylamine, benzylamine, phenethylamine or benzyldimethylamine.

The aromatic amine can be diphenyl(p-tolyl)amine, methyldiphenylamine, triphenylamine, phenylenediamine, naphthylamine, diaminonaphthalene, an aniline derivative, a pyrrole derivative, an oxazole derivative, a thiazole derivative, an imidazole derivative, a pyrroline derivative, a pyrrolidine derivative, a pyridine derivative or a quinoline derivative.

The amide derivative can be formamide, N-methylformamide, N,N-dimethylformamide, acetamide, N-methylacetamide, N,N-dimethylacetamide or benzamide.

The imide derivative can be phthalimide, succinimide or maleimide.

The nitrogen-containing compound having a hydroxy group can be 2-hydroxypyridine, monoethanolamine, diethanolamine, triethanolamine, N-ethyldiethanolamine, N,N-diethylethanolamine, triisopropanolamine, 2,2'-iminodiethanol, 2-aminoethanol, 3-amino-1-propanol, 4-amino-1-butanol, 2-(2-hydroxyethyl)pyridine, 1-(2-hydroxyethyl)piperazine, piperidine ethanol, 1-(2-hydroxyethyl)pyrrolidine, 1-(2-hydroxyethyl)-2-pyrrolidinone, 3-piperidino-1,2-propanediol, 3-tropanol, 1-methyl-2-pyrrolidine ethanol, 1-aziridine ethanol or N-(2-hydroxyethyl)phthalimide.

Furthermore, examples of the aniline derivative are aniline, N-methylaniline, N-ethylaniline, N-propylaniline, N,N-dimethylaniline, 2-methylaniline, 3-methylaniline, 4-methylaniline, ethylaniline, propylaniline and trimethylaniline.

Examples of the pyrrole derivative are pyrrole, 2H-pyrrole, 1-methylpyrrole, 2,4-dimethylpyrrole and N-methylpyrrole.

Examples of the oxazole derivative are oxazole and isoxazole.

Examples of the thiazole derivative are thiazole and isothiazole.

Examples of the imidazole derivative are imidazole and 4-methylimidazole.

Examples of the pyrroline derivative are pyrroline and 2-methyl-1-pyrroline.

Examples of the pyrrolidine derivative are pyrrolidine, N-methylpyrrolidine and N-methylpyrrolidone.

Examples of the pyridine derivative are pyridine, methylpyridine, ethylpyridine, propylpyridine, butylpyridine, 4-(1-butylpentyl)pyridine, dimethylpyridine, trimethylpyridine, triethylpyridine, phenylpyridine, aminopyridine and dimethylaminopyridine.

Examples of the quinoline derivative are quinoline and 3-quinoline carbonitrile.

The first pattern formation method of this invention includes the steps of forming a resist film on a substrate; forming a barrier film including a basic compound on the resist film; performing pattern exposure by selectively irradiating the resist film through the barrier film with exposing light with a liquid provided on the barrier film; removing the barrier film after the pattern exposure; and forming a resist pattern by developing the resist film after the pattern exposure.

In the first pattern formation method, the barrier film including a basic compound can prevent the elution of a component of the resist film into the immersion liquid and the permeation of the liquid into the resist film. Therefore, the resist film keeps the expected performance during the exposure, and hence, a resist pattern made of the resist film can be formed in a good shape.

The second pattern formation method of this invention includes the steps of forming a resist film on a substrate; forming a barrier film including a basic compound on the resist film; performing pattern exposure by selectively irradiating the resist film through the barrier film with exposing light with a liquid provided on the barrier film; and removing the barrier film and forming a resist pattern made of the resist film by developing the resist film after the pattern exposure.

In the second pattern formation method, the barrier film including a basic compound can prevent the elution of a component of the resist film into the immersion liquid and the permeation of the liquid into the resist film in the same manner as in the first pattern formation method. Therefore, the resist film keeps the expected performance during the exposure, and hence, a resist pattern made of the resist film can be formed in a good shape.

A difference between the first pattern formation method and the second pattern formation method is that the barrier film formed on the resist film is removed before the development in the first pattern formation method while it is removed during the development with a developer in the second pattern formation method. In the first pattern formation method, since the barrier film is removed before the development, the developing processing is ordinarily proceeded. In the second pattern formation method, since the barrier film is removed during the development, the dissolution characteristic of the resist can be controlled, and as a result, the dissolution characteristic of the resist can be improved. The control of the dissolution characteristic will be described later.

In the case where the barrier film including a basic compound is removed before the development as in the first pattern formation method, an aqueous solution with an appropriate pH value for dissolving the barrier film may be used. For example, an aqueous solution such as an alkaline developer or a diluted alkaline developer can be used. With respect to the degree of dilution of the diluted developer, the concentration is lower than that of a general developer (i.e., 2.38 wt % tetramethylammonium hydroxide) and is, for example, approximately 0.01% through 2%, which does not limit the invention.

The first or second pattern formation method preferably further includes, before the step of performing pattern exposure, a step of annealing the barrier film. When the barrier film including a basic compound is thus annealed, the film quality of the barrier film can be made dense, and hence, the insolubility in the immersion liquid can be increased. However, when the density of the barrier film is increased too much, it becomes difficult to dissolve the barrier film for removal, and therefore, it is preferably annealed at a temperature in an appropriate range. For example, the temperature is preferably approximately 100° C. through 150° C., which does not limit the invention.

In the first or second pattern formation method, the immersion liquid is preferably an acidic solution. Thus, even when the acidic solution permeates into the barrier film, the basic compound included in the barrier film neutralizes the permeating acidic solution, and therefore, the permeation of the acidic solution into the resist film can be more effectively prevented.

In this case, the acidic solution can be a cesium sulfate aqueous solution or a phosphoric acid aqueous solution.

Alternatively, the immersion liquid may be water in the first or second pattern formation method.

In the first or second pattern formation method, the exposing light can be KrF excimer laser, ArF excimer laser, ArKr laser, $Ar_2$ laser, $F_2$ laser or $Xe_2$ laser.

DETAILED DESCRIPTION OF THE INVENTION

Embodiment 1

A pattern formation method using a barrier film material according to Embodiment 1 of the invention will now be described with reference to FIGS. 1A through 1D, 2A and 2B.

First, a positive chemically amplified resist material having the following composition is prepared:

| | |
|---|---|
| Base polymer: poly((norbornene-5-methylene-t-butylcarboxylate) (50 mol %) - (maleic anhydride) (50 mol %)) | 2 g |
| Acid generator: triphenylsulfonium triflate | 0.06 g |
| Quencher: triethanolamine | 0.002 g |
| Solvent: propylene glycol monomethyl ether acetate | 20 g |

Figure 1A:
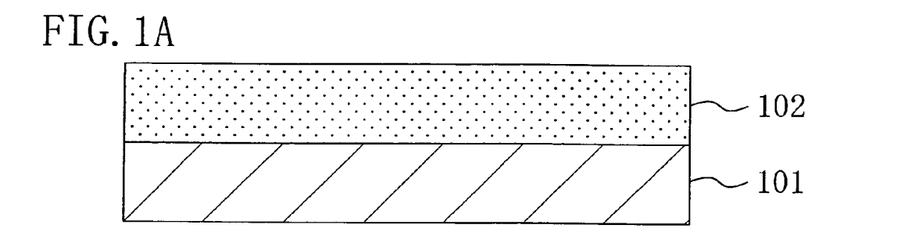
FIGS. 1A, 1B, 1C and 1D are cross-sectional views for showing procedures in a pattern formation method using a barrier film material according to Embodiment 1 of the invention.

Next, as shown in FIG. 1A, the aforementioned chemically amplified resist material is applied on a substrate 101 so as to form a resist film 102 with a thickness of 0.35 μm.

Figure 1B:
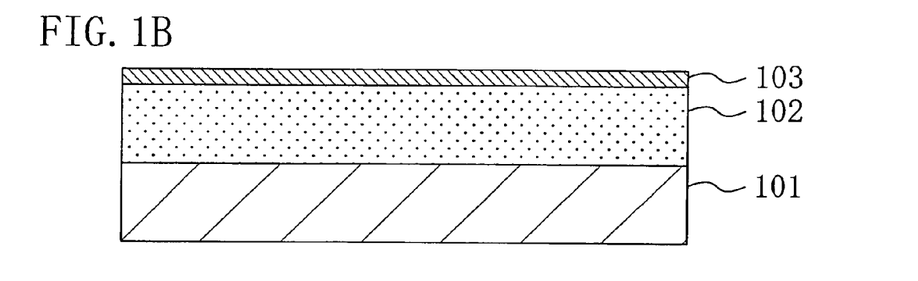

Then, as shown in FIG. 1B, by using a water-soluble barrier film material having the following composition, a barrier film 103 having a thickness of 0.07 μm and including dicyclohexylamine, that is, a basic compound, is formed on the resist film 102 by, for example, spin coating:

| | |
|---|---|
| Base polymer: polyvinyl hexafluoroisopropyl alcohol | 1 g |
| Basic additive: dicyclohexylamine | 0.05 g |
| Solvent: isopropyl alcohol | 20 g |

Figure 1C:
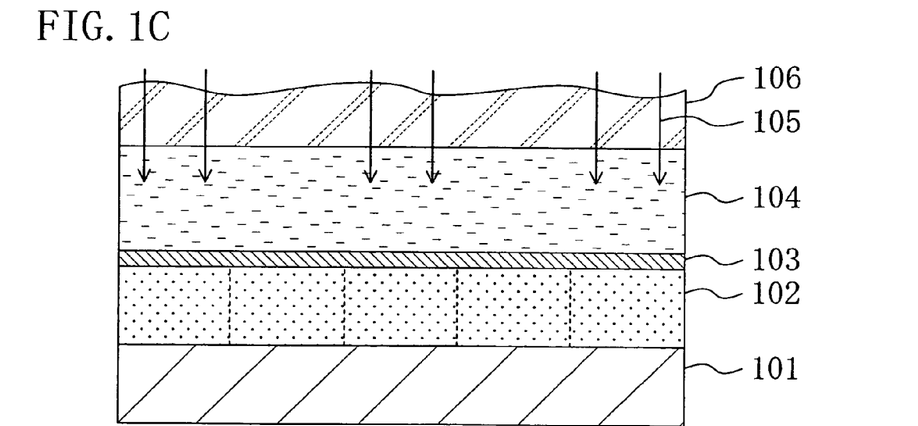

Next, as shown in FIG. 1C, with an immersion liquid 104 including, for example, 5 wt % of cesium sulfate provided between the barrier film 103 and a projection lens 106 by, for example, a puddle method, pattern exposure is carried out by irradiating the resist film 102 through the barrier film 103 with exposing light 105 of ArF excimer laser with NA of 0.68 having passed through a mask (not shown).

Figure 1D:
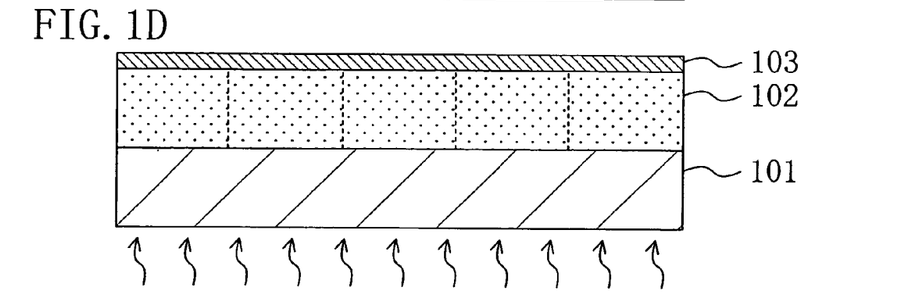

After the pattern exposure, as shown in FIG. 1D, the resist film 102 is baked with a hot plate at a temperature of 105° C. for 60 seconds (post exposure bake).

Figure 2A:
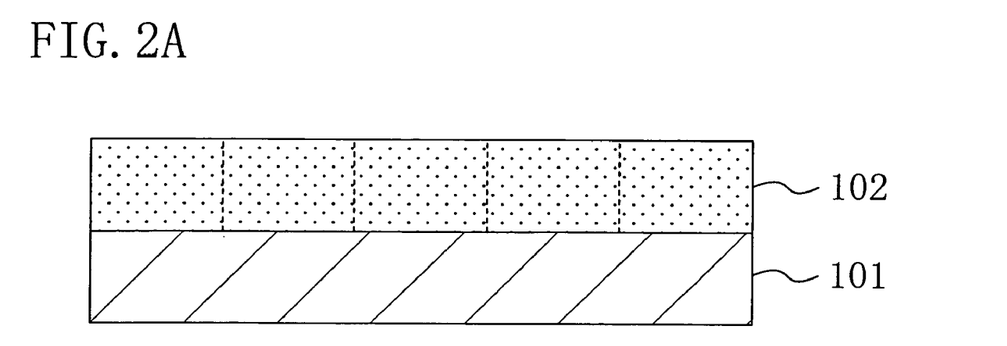
FIGS. 2A and 2B are cross-sectional views for showing other procedures in the pattern formation method using the barrier film material of Embodiment 1.

Next, as shown in FIG. 2A, the barrier film 103 is removed with, for example, a 0.01 wt % tetramethylammonium hydroxide aqueous solution (diluted alkaline developer).

Figure 2B:
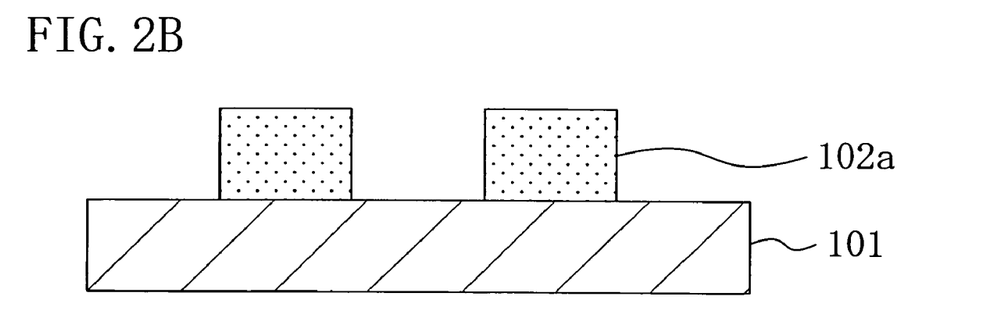

Thereafter, the resultant resist film 102 is developed with a 2.38 wt % tetramethylammonium hydroxide developer. In this manner, a resist pattern 102a made of an unexposed portion of the resist film 102 and having a line width of 0.09 μm is formed as shown in FIG. 2B.

In this manner, according to Embodiment 1, before carrying out the pattern exposure shown in FIG. 1C, the barrier film 103 including the basic compound of dicyclohexylamine is formed on the resist film 102. Therefore, the resist film 102 is never in direct contact with the immersion liquid 104. Accordingly, a component of the resist film 102 such as the acid generator or the quencher can be prevented from eluting into the immersion liquid 104 or the immersion liquid 104 can be prevented from permeating into the resist film 102 on the contrary. Therefore, the resist film 102 keeps the expected performance of the chemically amplified resist through the exposure and the post exposure bake performed thereafter. As a result, the resist pattern 102a made of the resist film 102 is in a good shape.

Embodiment 2

A pattern formation method using a barrier film material according to Embodiment 2 of the invention will now be described with reference to FIGS. 3A through 3D and 4A through 4C.

First, a positive chemically amplified resist material having the following composition is prepared:

| | |
|---|---|
| Base polymer: poly((norbornene-5-methylene-t-butylcarboxylate) (50 mol %) - (maleic anhydride) (50 mol %)) | 2 g |
| Acid generator: triphenylsulfonium triflate | 0.06 g |
| Quencher: triethanolamine | 0.002 g |
| Solvent: propylene glycol monomethyl ether acetate | 20 g |

Figure 3A:
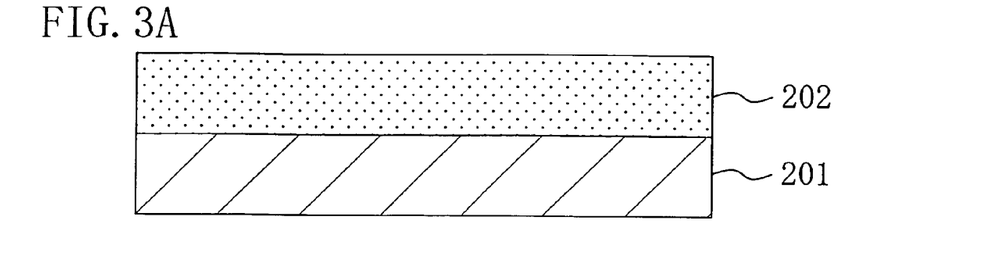
FIGS. 3A, 3B, 3C and 3D are cross-sectional views for showing procedures in a pattern formation method using a barrier film material according to Embodiment 2 of the invention.

Next, as shown in FIG. 3A, the aforementioned chemically amplified resist material is applied on a substrate 201 so as to form a resist film 202 with a thickness of 0.35 μm.

Figure 3B:
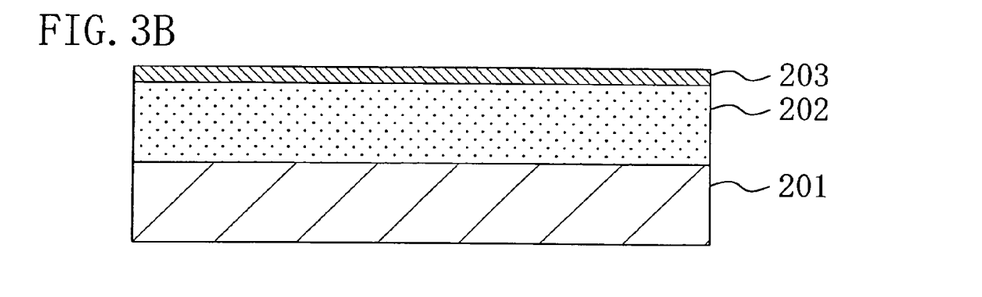

Then, as shown in FIG. 3B, by using a water-soluble barrier film material having the following composition, a barrier film 203 having a thickness of 0.07 μm and including tricyclopentylamine, that is, a basic compound, is formed on the resist film 202 by, for example, the spin coating:

| | |
|---|---|
| Base polymer: polyvinyl hexafluoroisopropyl alcohol | 1 g |
| Basic additive: tricyclopentylamine | 0.05 g |
| Solvent: n-butyl alcohol | 20 g |

Figure 3C:
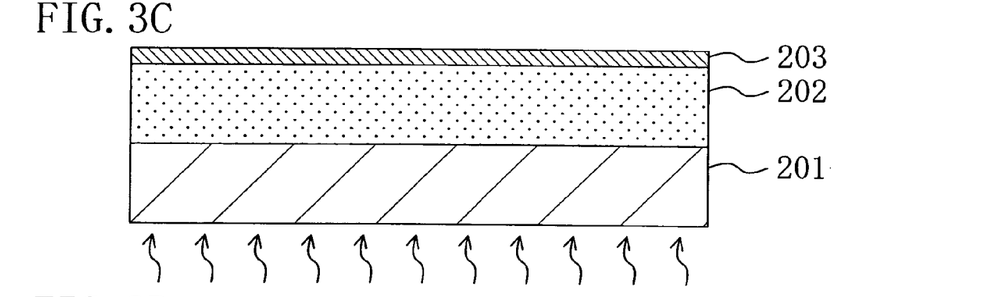

Next, as shown in FIG. 3C, the barrier film 203 is annealed with a hot plate at a temperature of 120° C. for 90 seconds, so as to improve the denseness of the barrier film 203.

Figure 3D:
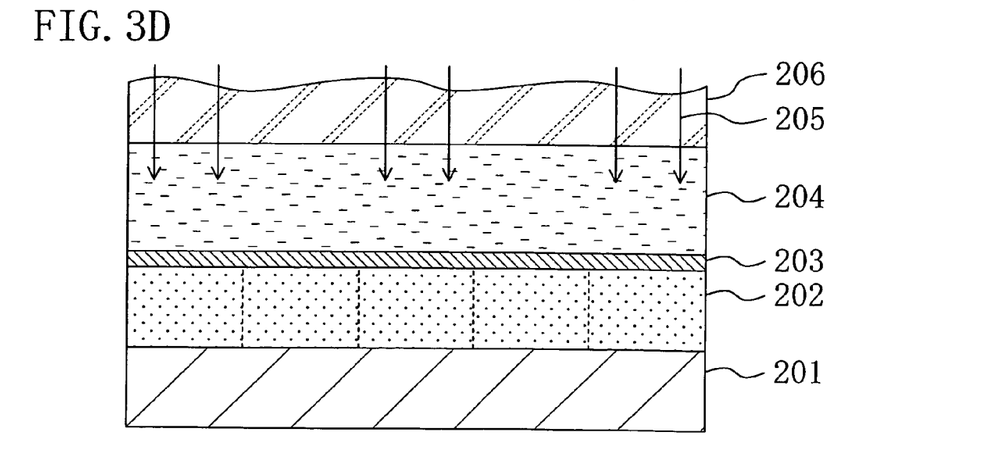

After the annealing, as shown in FIG. 3D, with an immersion liquid 204 of water provided between the barrier film 203 and a projection lens 206 by, for example, the puddle method, pattern exposure is carried out by irradiating the resist film 202 through the barrier film 203 with exposing light 205 of ArF excimer laser with NA of 0.68 having passed through a mask (not shown).

Figure 4A:
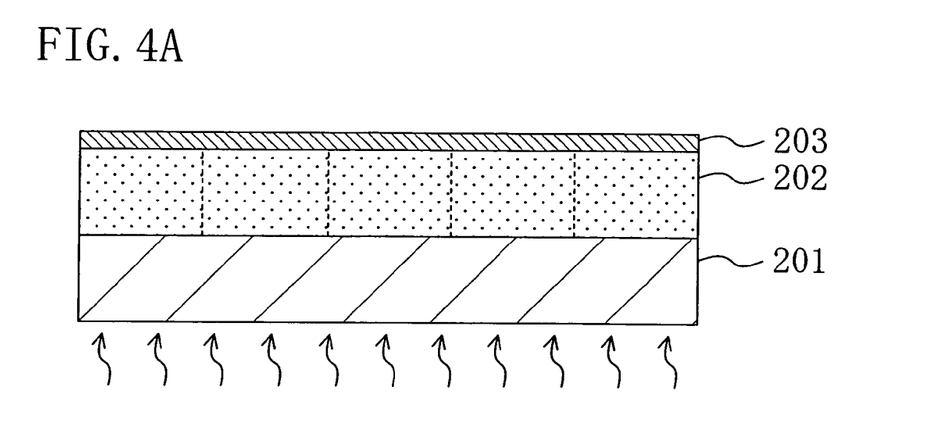
FIGS. 4A, 4B and 4C are cross-sectional views for showing other procedures in the pattern formation method using the barrier film material of Embodiment 2.

After the pattern exposure, as shown in FIG. 4A, the resist film 202 is baked with a hot plate at a temperature of 105° C. for 60 seconds (post exposure bake).

Figure 4B:
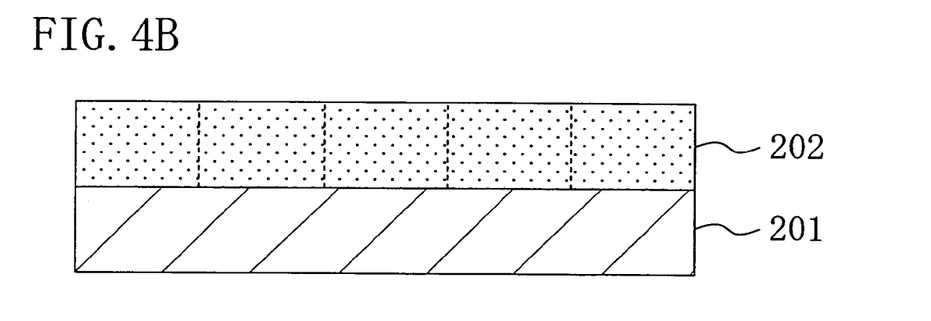

Next, as shown in FIG. 4B, the barrier film 203 is removed with, for example, a 0.005 wt % tetramethylammonium hydroxide aqueous solution (diluted alkaline developer).

Figure 4C:
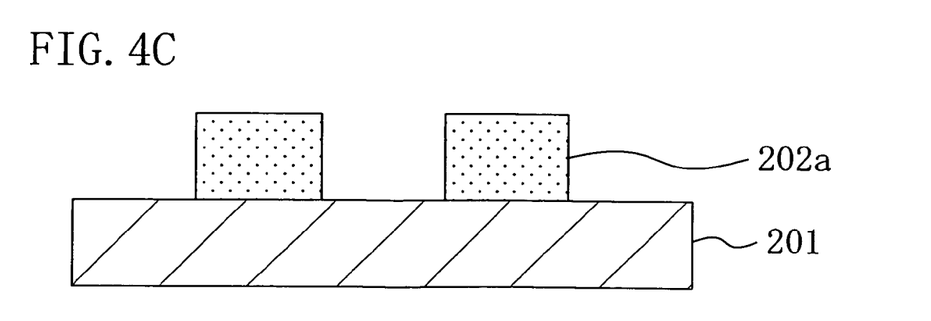

Thereafter, the resultant resist film 202 is developed with a 2.38 wt % tetramethylammonium hydroxide developer. In this manner, a resist pattern 202a made of an unexposed portion of the resist film 202 and having a line width of 0.09 μm is formed as shown in FIG. 4C.

In this manner, according to Embodiment 2, before carrying out the pattern exposure shown in FIG. 3D, the barrier film 203 including the basic compound of tricyclopentylamine is formed on the resist film 202. Therefore, the resist film 202 is never in direct contact with the immersion liquid 204. Accordingly, a component of the resist film 202 such as the acid generator or the quencher can be prevented from eluting into the immersion liquid 204 or the immersion liquid 204 can be prevented from permeating into the resist film 202 on the contrary. Therefore, the resist film 202 keeps the expected performance of the chemically amplified resist through the exposure and the post exposure bake performed thereafter. As a result, the resist pattern 202a made of the resist film 202 is in a good shape.

In addition, in Embodiment 2, since the barrier film 203 is annealed for improving the denseness as shown in FIG. 3C before the pattern exposure, the insolubility of the barrier film 203 in the immersion liquid 204 is increased. Therefore, the function of the barrier film 203 as a barrier for preventing the acid generator or the like from eluting from the resist film 202 into the immersion liquid 204 can be improved.

Embodiment 3

A pattern formation method using a barrier film material according to Embodiment 3 of the invention will now be described with reference to FIGS. 5A through 5D and 6.

First, a positive chemically amplified resist material having the following composition is prepared:

| | |
|---|---|
| Base polymer: poly((norbornene-5-methylene-t-butylcarboxylate) (50 mol %) - (maleic anhydride) (50 mol %)) | 2 g |
| Acid generator: triphenylsulfonium triflate | 0.06 g |
| Quencher: triethanolamine | 0.002 g |
| Solvent: propylene glycol monomethyl ether acetate | 20 g |

Figure 5A:
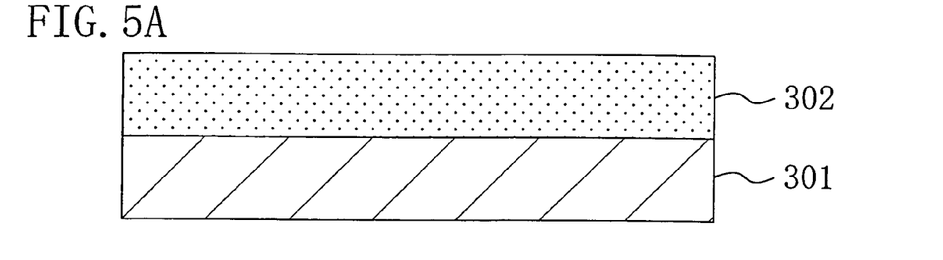
FIGS. 5A, 5B, 5C and 5D are cross-sectional views for showing procedures in a pattern formation method using a barrier film material according to Embodiment 3 of the invention.

Next, as shown in FIG. 5A, the aforementioned chemically amplified resist material is applied on a substrate 301 so as to form a resist film 302 with a thickness of 0.35 μm.

Figure 5B:
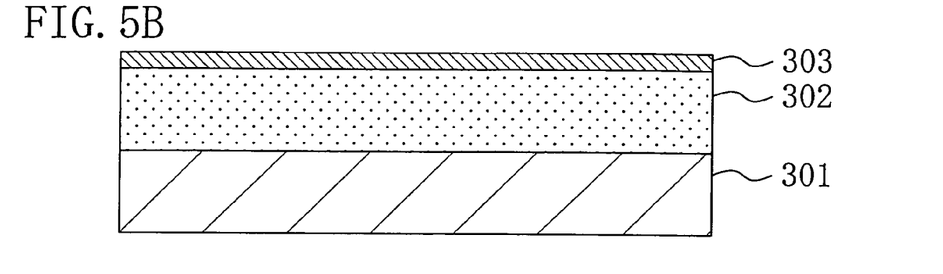

Then, as shown in FIG. 5B, by using a water-soluble barrier film material having the following composition, a barrier film 303 having a thickness of 0.09 μm and including tricyclohexylamine, that is, a basic compound, is formed on the resist film 302 by, for example, the spin coating:

| | |
|---|---:|
| Base polymer: polyvinyl hexafluoroisopropyl alcohol | 1 g |
| Basic additive: tricyclohexylamine | 0.03 g |
| Solvent: isopropyl alcohol | 20 g |

Figure 5C:
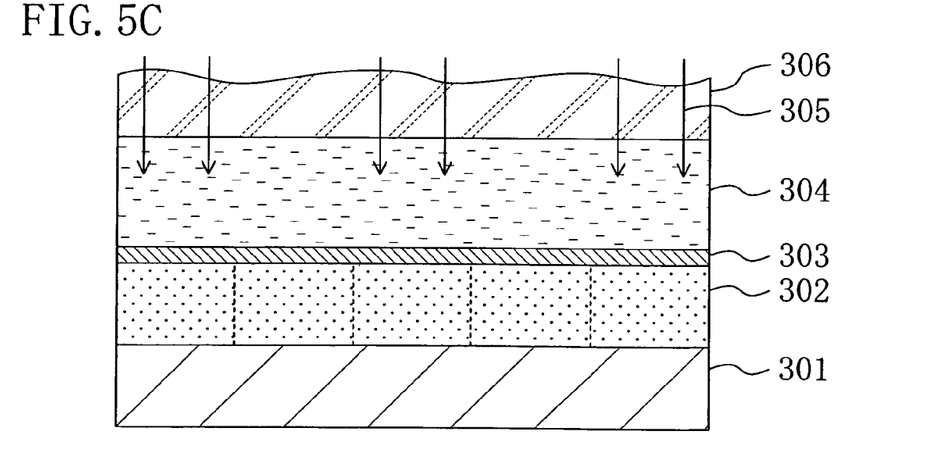

Next, as shown in FIG. 5C, with an immersion liquid 304 including, for example, 3 wt % of phosphoric acid provided between the barrier film 303 and a projection lens 306 by, for example, the puddle method, pattern exposure is carried out by irradiating the resist film 302 through the barrier film 303 with exposing light 305 of ArF excimer laser with NA of 0.68 having passed through a mask (not shown).

Figure 5D:
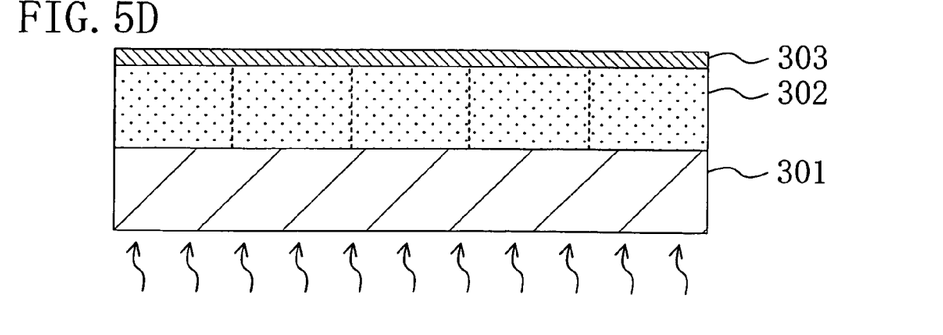

After the pattern exposure, as shown in FIG. 5D, the resist film 302 is baked with a hot plate at a temperature of 105° C. for 60 seconds (post exposure bake).

Figure 6:
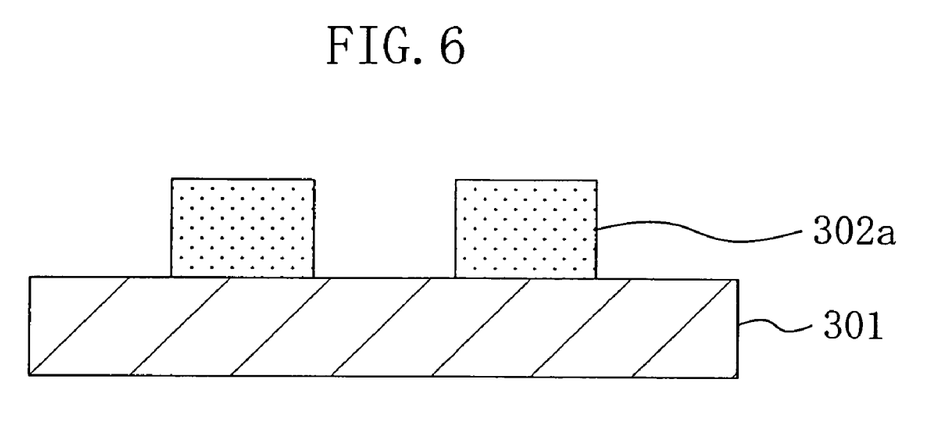
FIG. 6 is a cross-sectional view for showing another procedure in the pattern formation method using the barrier film material of Embodiment 3.

Next, the barrier film 303 is removed and the resultant resist film 302 is developed with a 2.38 wt % tetramethylammonium hydroxide developer. In this manner, a resist pattern 302a made of an unexposed portion of the resist film 302 and having a line width of 0.09 μm is formed as shown in FIG. 6.

In this manner, according to Embodiment 3, before carrying out the pattern exposure shown in FIG. 5C, the barrier film 303 including the basic compound of tricyclohexylamine is formed on the resist film 302. Therefore, the resist film 302 is never in direct contact with the immersion liquid 304. Accordingly, a component of the resist film 302 such as the acid generator or the quencher can be prevented from eluting into the immersion liquid 304 or the immersion liquid 304 can be prevented from permeating into the resist film 302 on the contrary. Therefore, the resist film 302 keeps the expected performance of the chemically amplified resist through the exposure and the post exposure bake performed thereafter. As a result, the resist pattern 302a made of the resist film 302 is in a good shape.

In the pattern formation method of Embodiment 3, the barrier film 303 is removed during the development, namely, with the alkaline developer, differently from those of Embodiments 1 and 2. Thus, the dissolution characteristic of the resist film 302 can be controlled. The control of the dissolution characteristic will now be described with reference to the accompanying drawing.

Figure 7:
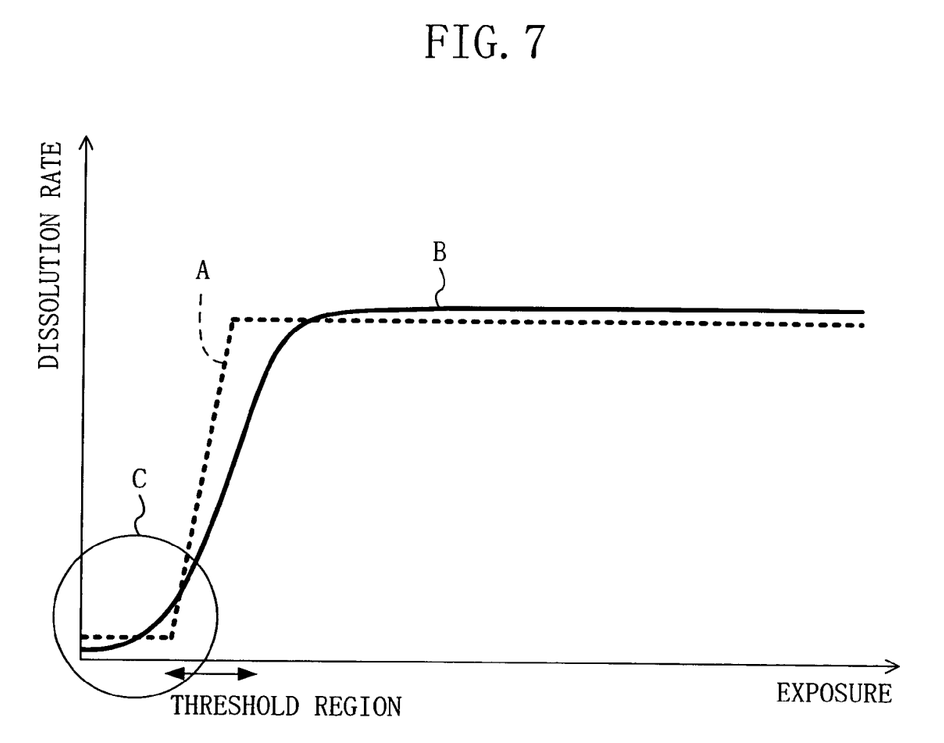
FIG. 7 is a graph for explaining control of solubility of a resist in the pattern formation method using the barrier film material of Embodiment 3.

In general, when the dissolution characteristic of a resist in a developer is high, the dissolution rate is abruptly increased when exposure exceeds a given threshold value as shown with a graph A of a broken line in FIG. 7. As the change of the dissolution rate against the exposure is more abrupt, a difference in the solubility between an exposed portion and an unexposed portion of the resist film 302 is larger, and hence, higher resolution can be attained, namely, the resist pattern 302a can be formed in a better shape. Accordingly, in the case where the barrier film 303 is removed simultaneously with the development, the dissolution rate is wholly lowered during the removal of the barrier film 303 as shown with a graph B of a solid line in FIG. 7, and hence, the change in a portion surrounded with a circle C in the graph B can be reduced to be approximated to a flat portion of the graph A. As a result, in the case where the actual resist has the dissolution characteristic as shown with the graph B, the dissolution rate attained with smaller exposure can be adjusted to attain a comparatively constant solution state with small exposure and a low dissolution rate within a given range. Accordingly, the difference in the solubility between an exposed portion and an unexposed portion of the resist film 302 can be substantially increased, resulting in easily forming a resist pattern in a good shape.

Embodiment 4

A pattern formation method using a barrier film material according to Embodiment 4 of the invention will now be described with reference to FIGS. 8A through 8D, 9A and 9B.

First, a positive chemically amplified resist material having the following composition is prepared:

| | |
|---|---:|
| Base polymer: poly((norbornene-5-methylene-t-butylcarboxylate) (50 mol %) - (maleic anhydride) (50 mol %)) | 2 g |
| Acid generator: triphenylsulfonium triflate | 0.06 g |
| Quencher: triethanolamine | 0.002 g |
| Solvent: propylene glycol monomethyl ether acetate | 20 g |

Figure 8A:
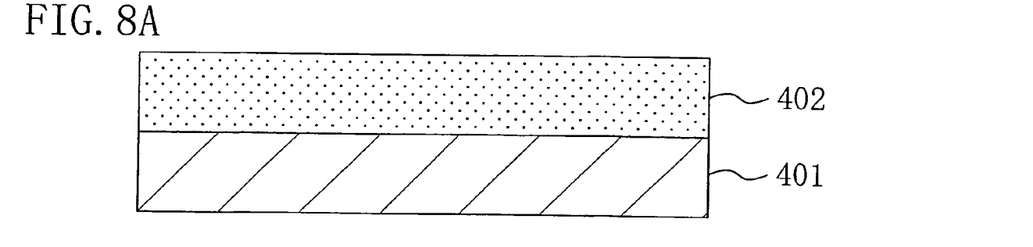
FIGS. 8A, 8B, 8C and 8D are cross-sectional views for showing procedures in a pattern formation method using a barrier film material according to Embodiment 4 of the invention.

Next, as shown in FIG. 8A, the aforementioned chemically amplified resist material is applied on a substrate 401 so as to form a resist film 402 with a thickness of 0.35 μm.

Figure 8B:
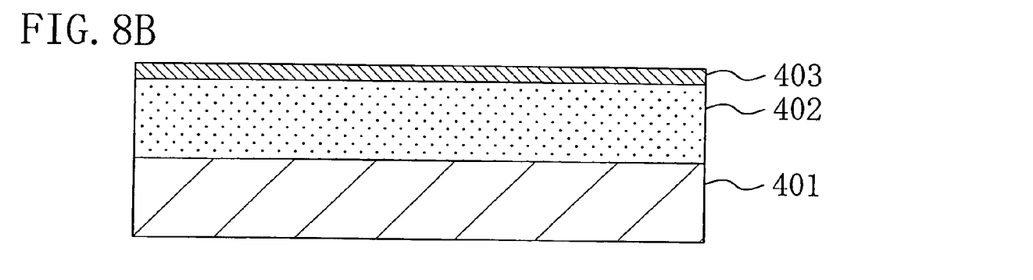

Then, as shown in FIG. 8B, by using a water-soluble barrier film material having the following composition, a barrier film 403 having a thickness of 0.08 μm and including N-methyl pyrrolidone, that is, a basic compound, is formed on the resist film 402 by, for example, the spin coating:

| | |
|---|---:|
| Base polymer: polyvinyl hexafluoroisopropyl alcohol | 1 g |
| Basic additive: N-methyl pyrrolidone | 0.03 g |
| Solvent: n-butyl alcohol | 20 g |

Figure 8C:
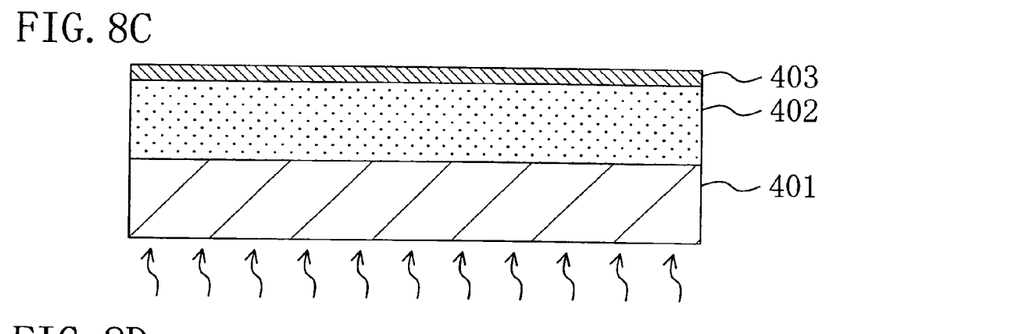

Next, as shown in FIG. 8C, the barrier film 403 is annealed with a hot plate at a temperature of 115° C. for 90 seconds, so as to improve the denseness of the barrier film 403.

Figure 8D:
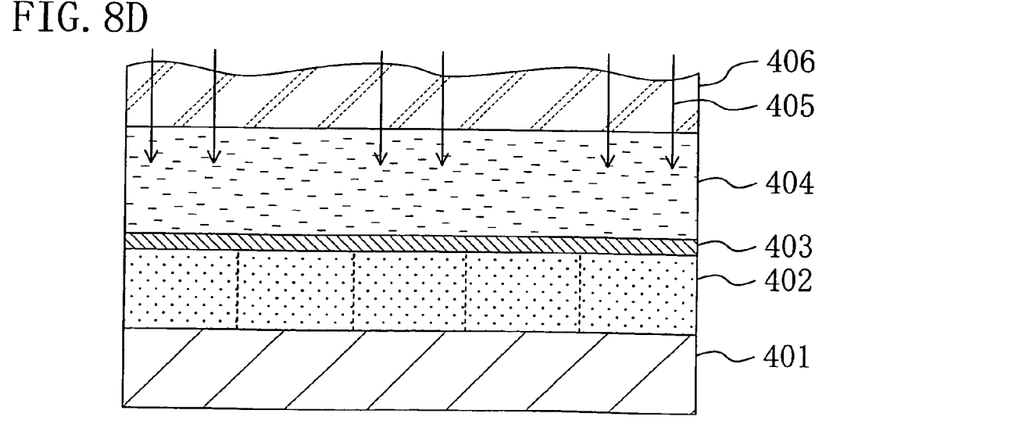

After the annealing, as shown in FIG. 8D, with an immersion liquid 404 of water provided between the barrier film 403 and a projection lens 406 by, for example, the puddle method, pattern exposure is carried out by irradiating the resist film 402 through the barrier film 403 with exposing light 405 of ArF excimer laser with NA of 0.68 having passed through a mask (not shown).

Figure 9A:
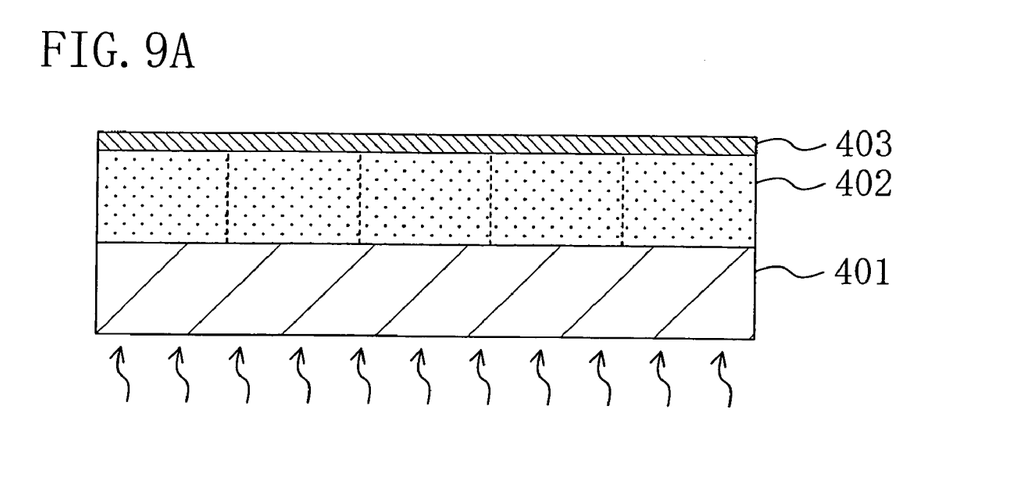
FIGS. 9A and 9B are cross-sectional views for showing other procedures in the pattern formation method using the barrier film material of Embodiment 4.

After the pattern exposure, as shown in FIG. 9A, the resist film 402 is baked with a hot plate at a temperature of 105° C. for 60 seconds (post exposure bake).

Figure 9B:
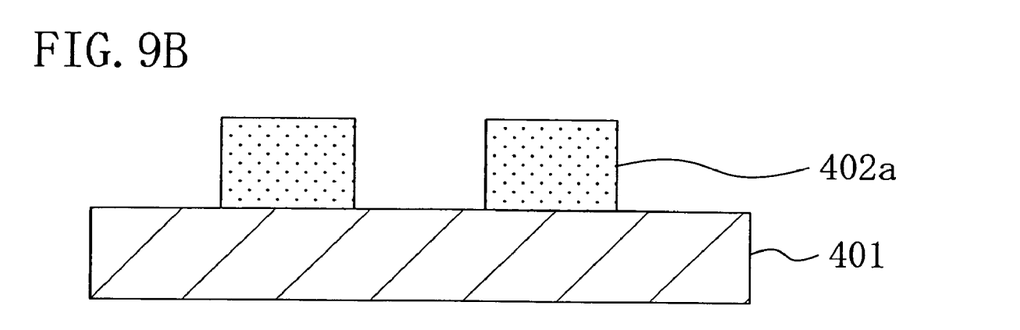

Next, the barrier film 403 is removed and the resultant resist film 402 is developed with a 2.38 wt % tetramethylammonium hydroxide developer. In this manner, a resist pattern 402a made of an unexposed portion of the resist film 402 and having a line width of 0.09 μm is formed as shown in FIG. 9B.

In this manner, according to Embodiment 4, before carrying out the pattern exposure shown in FIG. 8D, the barrier film 403 including the basic compound of N-methyl pyrrolidone is formed on the resist film 402. Therefore, the resist film 402 is never in direct contact with the immersion liquid 404. Accordingly, a component of the resist film 402 such as the acid generator or the quencher can be prevented from eluting into the immersion liquid 404 or the immersion liquid 404 can be prevented from permeating into the resist film 402 on the contrary, and hence, the resist film 402 keeps the expected performance of the chemically amplified resist through the exposure and the post exposure bake performed thereafter. As a result, the resist pattern 402a made of the resist film 402 is in a good shape.

In addition, in Embodiment 4, since the barrier film 403 is annealed for improving the denseness as shown in FIG. 8C before the pattern exposure, the insolubility of the barrier film 403 in the immersion liquid 404 is increased. Therefore, the function of the barrier film 403 as a barrier for preventing the acid generator or the like from eluting from the resist film 402 into the immersion liquid 404 can be improved.

Also, since the barrier film 403 is removed during the development, namely, with the alkaline developer, in the same manner as in Embodiment 3, the dissolution characteristic of the resist film 402 can be controlled.

In each of Embodiments 1 through 4, the thickness of the barrier film is approximately 0.10 μm, which does not limit the invention. The lower limit of the thickness is, for example, a thickness sufficient for preventing the component of the resist film from eluting into the immersion liquid or preventing the immersion liquid from permeating into the resist film, and the upper limit is a thickness not preventing the transmission of the exposing light and easily removed.

Although the exposing light is ArF excimer laser in each of Embodiments 1 through 4, the exposing light is not limited to it but may be KrF excimer laser, ArKr laser, $Ar_2$ laser, $F_2$ laser or $Xe_2$ laser instead.

Furthermore, the puddle method is employed for providing the immersion liquid onto the barrier film in each of Embodiments 1 through 4, which does not limit the invention, and for example, a dip method in which the whole substrate is dipped in the immersion liquid may be employed instead.

Moreover, although a positive chemically amplified resist is used for forming the resist film in each embodiment, the present invention is applicable also to a negative chemically amplified resist.

Also, the resist is not limited to a chemically amplified resist.

As described so far, according to the barrier film material and the pattern formation method using the same of this invention, the influence of an immersion liquid on a resist film can be prevented, so that a resist pattern can be formed in a good shape. Accordingly, the present invention is useful as a method for forming a fine pattern to be employed in fabrication process or the like for semiconductor devices.

What is claimed is:

1. A pattern formation method comprising the steps of:
   forming a resist film on a substrate;
   forming a barrier film on said resist film;
   performing pattern exposure by selectively irradiating said resist film through said barrier film with exposing light with a liquid provided on said barrier film;
   removing said barrier film after the pattern exposure; and
   forming a resist pattern by developing said resist film after the pattern exposure,
   wherein said barrier film is formed by using a barrier film material including a base polymer, a basic compound and a solvent different from said basic compound,
   the method further comprises, before the step of performing pattern exposure, a step of annealing said barrier film.

2. The pattern formation method of claim 1,
   wherein said basic compound is a cycloaliphatic amine.

3. The pattern formation method of claim 2,
   wherein said cycloaliphatic amine is cyclopentylamine, dicyclopentylamine, tricyclopentylamine, cyclohexylamine, dicyclohexylamine or tricyclohexylamine.

4. The pattern formation method of claim 1,
   wherein said basic compound is a primary aliphatic amine, a secondary aliphatic amine, a tertiary aliphatic amine, an aromatic amine, an amide derivative, an imide derivative or a nitrogen-containing compound having a hydroxy group.

5. The pattern formation method of claim 4,
   wherein said primary aliphatic amine is ammonia, methylamine, ethylamine, n-propylamine, isopropylamine, n-butylamine or isobutylamine,
   said secondary aliphatic amine is dimethylamine, diethylamine, di-n-propylamine, diisopropylamine, di-n-butylamine, diisobutylamine, di-sec-butylamine, dipentylamine, dicyclopentylamine, dihexylamine or dicyclohexylamine,
   said tertiary aliphatic amine is trimethylamine, triethylamine, tri-n-propylamine, triisopropylamine, tri-n-butylamine, triisobutylamine, tri-sec-butylamine, tripentylamine, tricyclopentylamine, trihexylamine, tricyclohexylamine, dimethylethylamine, methylethylpropylamine, benzylamine, phenethylamine or benzyldimethylamine,
   said aromatic amine is diphenyl(p-tolyl)amine, methyldiphenylamine, triphenylamine, phenylenediamine, naphthylamine, diaminonaphthalene, an aniline derivative, a pyrrole derivative, an oxazole derivative, a thiazole derivative, an imidazole derivative, a pyrroline derivative, a pyrrolidine derivative, a pyridine derivative or a quinoline derivative,
   said amide derivative is formamide, N-methylformamide, N,N-dimethylformamide, acetamide, N-methylacetamide, N,N-dimethylacetamide or benzamide,
   said imide derivative is phthalimide, succinimide or maleimide, and
   said nitrogen-containing compound having a hydroxy group is 2-hydroxypyridine, monoethanolamine, diethanolamine, triethanolamine, N-ethyldiethanolamine, N,N-diethylethanolamine, triisopropanolamine, 2,2'-iminodiethanol, 2-aminoethanol, 3-amino-1-propanol, 4-aminoe-1-butanol, 2-(2-hydroxyethyl)pyridine, 1-(2-hydroxyethyl)piperazine, pyperidine ethanol, 1-(2-hydroxyethyl)pyrrolidine, 1-(2-hydroxyethyl)-2-pyrrolidinone, 3-pyperidino-1,2-propanediol, 3-tropanol, 1-methyl-2-pyrrolidine ethanol, 1-aziridine ethanol or N-(2-hydroxyethyl)phthalimide.

6. The pattern formation method of claim 1,
   wherein said liquid is an acidic solution or water.

7. The pattern formation method of claim 6,
   wherein said acidic solution is a cesium sulfate aqueous solution or a phosphoric acid aqueous solution.

8. The pattern formation method of claim 1,
   wherein said exposing light is KrF excimer laser, ArF excimer laser, ArKr laser, $Ar_2$ laser, $F_2$ laser or $Xe_2$ laser.

9. A pattern formation method comprising the steps of:
   forming a resist film on a substrate;
   forming a barrier film including a basic compound on said resist film;
   performing pattern exposure by selectively irradiating said resist film through said barrier film with exposing light with a liquid provided on said barrier film; and
   removing said barrier film and forming a resist pattern made of said resist film by developing said resist film after the pattern exposure, the method further comprises, before the step of performing pattern exposure, a step of annealing said barrier film.

10. The pattern formation method of claim 9, wherein said basic compound is a cycloaliphatic amine.

11. The pattern formation method of claim 10, wherein said cycloaliphatic amine is cyclopentylamine, dicyclopentylamine, tricyclopentylamine, cyclohexylamine, dicyclohexylamine or tricyclohexylamine.

12. The pattern formation method of claim 9, wherein said basic compound is a primary aliphatic amine, a secondary aliphatic amine, a tertiary aliphatic amine, an aromatic amine, an amide derivative, an imide derivative or a nitrogen-containing compound having a hydroxy group.

13. The pattern formation method of claim 12, wherein said primary aliphatic amine is ammonia, methylamine, ethylamine, n-propylamine, isopropylamine, n-butylamine or isobutylamine, said secondary aliphatic amine is dimethylamine, diethylamine, di-n-propylamine, diisopropylamine, di-n-butylamine, diisobutylamine, di-sec-butylamine, dipentylamine, dicyclopentylamine, dihexylamine or dicyclohexylamine, said tertiary aliphatic amine is trimethylamine, triethylamine, tri-n-propylamine, triisopropylamine, tri-n-butylamine, triisobutylamine, tri-sec-butylamine, tripentylamine, tricyclopentylamine, trihexylamine, tricyclohexylamine, dimethylethylamine, methylethylpropylamine, benzylamine, phenethylamine or benzyldimethylamine, said aromatic amine is diphenyl(p-tolyl)amine, methyldiphenylamine, triphenylamine, phenylenediamine, naphthylamine, diaminonaphthalene, an aniline derivative, a pyrrole derivative, an oxazole derivative, a thiazole derivative, an imidazole derivative, a pyrroline derivative, a pyrrolidine derivative, a pyridine derivative or a quinoline derivative, said amide derivative is formamide, N-methylformamide, N,N-dimethylformamide, acetamide, N-methylacetamide, N, N-dimethylacetamide or benzamide, said imide derivative is phthalimide, succinimide or maleimide, and said nitrogen-containing compound having a hydroxy group is 2-hydroxypyridine, monoethanolamine, diethanolamine, triethanolamine, N-ethyldiethanolamine, N,N-diethylethanolamine, triisopropanolamine, 2,2'-iminodiethanol, 2-aminoethanol, 3-amino-1-propanol, 4-aminoe-1-butanol, 2-(2-hydroxyethyl)pyridine, 1-(2-hydroxyethyl)piperazine, pyperidine ethanol, 1-(2-hydroxyethyl)pyrrolidine, 1-(2-hydroxyethyl)-2-pyrrolidinone, 3-pyperidino-1,2-propanediol, 3-tropanol, 1-methyl-2-pyrrolidine ethanol, 1-aziridine ethanol or N-(2-hydroxyethyl)phthalimide.

14. The pattern formation method of claim 9, wherein said liquid is an acidic solution or water.

15. The pattern formation method of claim 14, wherein said acidic solution is a cesium sulfate aqueous solution or a phosphoric acid aqueous solution.

16. The pattern formation method of claim 9, wherein said exposing light is KrF excimer laser, ArF excimer laser, ArKr laser, $Ar_2$ laser, $F_2$ laser or $Xe_2$ laser.

* * * * *